(12) United States Patent
Canac et al.

(10) Patent No.: US 10,133,700 B2
(45) Date of Patent: *Nov. 20, 2018

(54) SOURCE SYNCHRONOUS DATA STROBE MISALIGNMENT COMPENSATION MECHANISM

(71) Applicant: VIA TECHNOLOGIES, INC., New Taipei (TW)

(72) Inventors: Vanessa Canac, Austin, TX (US); James R. Lundberg, Austin, TX (US)

(73) Assignee: VIA TECHNOLOGIES, INC., New Taipei (TW)

( * ) Notice: Subject to any disclaimer, the term of this patent is extended or adjusted under 35 U.S.C. 154(b) by 38 days.

This patent is subject to a terminal disclaimer.

(21) Appl. No.: 15/389,517

(22) Filed: Dec. 23, 2016

(65) Prior Publication Data

US 2017/0103790 A1    Apr. 13, 2017

Related U.S. Application Data

(63) Continuation of application No. 13/747,038, filed on Jan. 22, 2013, now Pat. No. 9,552,320.

(51) Int. Cl.
*G06F 13/42* (2006.01)
*G06F 1/12* (2006.01)
(Continued)

(52) U.S. Cl.
CPC ............ *G06F 13/4243* (2013.01); *G06F 1/12* (2013.01); *G06F 13/4217* (2013.01); *G11C 7/1072* (2013.01); *G11C 8/18* (2013.01)

(58) Field of Classification Search
None
See application file for complete search history.

(56) References Cited

U.S. PATENT DOCUMENTS 5,272,390 A    12/1993    Watson, Jr. et al.
5,371,880 A    12/1994    Bhattacharya
(Continued)

*Primary Examiner* — Kim Huynh
*Assistant Examiner* — Danny Chan
(74) *Attorney, Agent, or Firm* — McClure, Qualey & Rodack, LLP

(57) ABSTRACT

An apparatus is provided that compensates for misalignment on a synchronous data bus, the apparatus includes a replica radial distribution element, a bit lag control element, and a synchronous lag receiver. The replica radial distribution element is configured to receive a lag pulse signal, and is configured to generate a replicated strobe signal, where the replica radial distribution network includes replicated propagation path lengths, loads, and buffering of a radial distribution network for a strobe. The bit lag control element is configured to measure the time between assertion of the lag pulse signal and assertion of the replicated strobe signal, and is configured to generate a first value on a lag bus that indicates the time. The bit lag control element has delay lock control that is configured to select one of a plurality of successively delayed versions of the lag pulse signal that coincides with the assertion the replicated strobe signal, and is configured to generate a second value on a lag select bus that indicates the propagation time, where the delay lock control selects the one of a plurality of successively delayed versions of the lag pulse signal by incrementing and decrementing bus states of select inputs on a mux, and where the plurality of successively delayed versions comprises inputs to the mux, and where the plurality of successively delayed versions comprises outputs a first plurality of series-coupled matched inverter pairs. The synchronous lag receiver is coupled to the bit lag control element, and is configured to receive a first one of a plurality of radially distributed strobes and a data bit, and is configured to delay registering of the data bit by the time.

21 Claims, 7 Drawing Sheets

(51) Int. Cl.
*G11C 8/18* (2006.01)
*G11C 7/10* (2006.01)

(56) References Cited

U.S. PATENT DOCUMENTS

| | | | |
|---|---|---|---|
| 5,668,774 A | 9/1997 | Furutani | |
| 5,867,695 A | 2/1999 | Amini et al. | |
| 5,892,927 A | 4/1999 | Boehmer et al. | |
| 6,202,168 B1 | 3/2001 | Saito et al. | |
| 6,247,137 B1 | 6/2001 | Wickeraad | |
| 6,275,555 B1 | 8/2001 | Song | |
| 6,381,704 B1 | 4/2002 | Cano et al. | |
| 6,452,421 B2 | 9/2002 | Saito | |
| 6,646,953 B1 | 11/2003 | Stark | |
| 6,813,724 B2 | 11/2004 | Saito | |
| 6,892,314 B2 | 5/2005 | Chen | |
| 6,906,555 B2 | 6/2005 | Ma | |
| 7,178,048 B2 | 2/2007 | Smith et al. | |
| 7,280,417 B2 | 10/2007 | Choi et al. | |
| 7,283,380 B1 | 10/2007 | Srinivasan et al. | |
| 7,315,599 B1 | 1/2008 | Morriss | |
| 7,490,187 B2 | 2/2009 | Moll et al. | |
| 7,543,090 B2 | 6/2009 | Lundberg | |
| 7,590,211 B1 | 9/2009 | Burney | |
| 7,770,047 B2 | 8/2010 | Kelly | |
| 7,793,007 B2 | 9/2010 | Ramsdale | |
| 7,804,923 B2 | 9/2010 | Lundberg | |
| 7,995,619 B2 | 8/2011 | Ja et al. | |
| 8,886,855 B2 * | 11/2014 | Canac | G06F 17/30581 710/1 |
| 9,319,035 B2 * | 4/2016 | Canac | H03K 5/06 |
| 9,552,320 B2 * | 1/2017 | Canac | G06F 13/4217 |
| 9,552,321 B2 * | 1/2017 | Canac | G06F 13/4217 |
| 9,557,765 B2 * | 1/2017 | Canac | G06F 13/4217 |
| 9,898,036 B2 * | 2/2018 | Canac | G06F 13/4217 |
| 9,953,002 B2 * | 4/2018 | Canac | G06F 13/4243 |
| 2002/0176315 A1 | 11/2002 | Graaff | |
| 2003/0217225 A1 | 11/2003 | Jang et al. | |
| 2003/0217303 A1 | 11/2003 | Chua-Eoan et al. | |
| 2004/0113654 A1 | 6/2004 | Lundberg | |
| 2005/0102545 A1 | 5/2005 | Clavequin et al. | |
| 2005/0195928 A1 | 9/2005 | Yamazaki | |
| 2006/0140022 A1 | 6/2006 | Lee | |
| 2007/0074061 A1 | 3/2007 | Lin et al. | |
| 2007/0139085 A1 | 6/2007 | Elliot et al. | |
| 2007/0140040 A1 | 6/2007 | Aoki et al. | |
| 2007/0217559 A1 | 9/2007 | Stott et al. | |
| 2008/0013663 A1 | 1/2008 | Cornelius et al. | |
| 2008/0168298 A1 | 7/2008 | Bellows et al. | |
| 2008/0180147 A1 | 7/2008 | Gaskins et al. | |
| 2008/0184095 A1 | 7/2008 | Lundberg et al. | |
| 2008/0297221 A1 | 12/2008 | Denda et al. | |
| 2009/0322398 A1 | 12/2009 | To et al. | |
| 2010/0215118 A1 | 8/2010 | Ware et al. | |
| 2011/0062999 A1 | 3/2011 | Nimaiyar et al. | |
| 2012/0056870 A1 | 3/2012 | Koh | |
| 2012/0331324 A1 | 12/2012 | Gaskins et al. | |
| 2012/0331326 A1 | 12/2012 | Gaskins et al. | |
| 2012/0331330 A1 | 12/2012 | Gaskins et al. | |
| 2014/0208148 A1 | 7/2014 | Canac et al. | |
| 2014/0208149 A1 | 7/2014 | Canac et al. | |
| 2017/0102734 A1 * | 4/2017 | Canac | G06F 1/12 |
| 2017/0109306 A1 * | 4/2017 | Canac | G06F 13/3625 |
| 2017/0110163 A1 * | 4/2017 | Canac | G11C 7/1072 |

* cited by examiner

EXEMPLARY SOURCE SYNCHRONOUS DATA PHASE FOR 8-BYTE TRANSFER

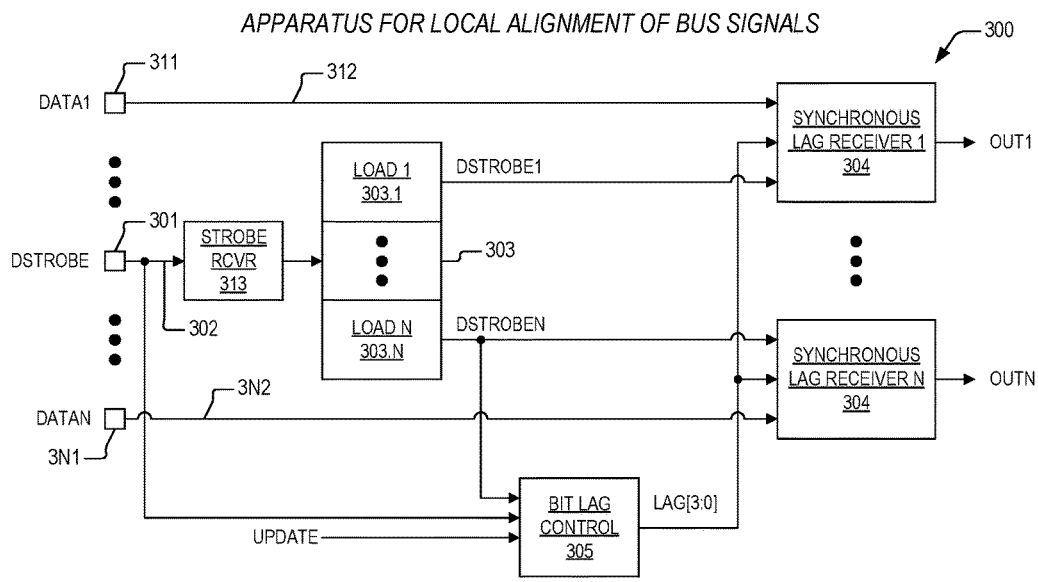
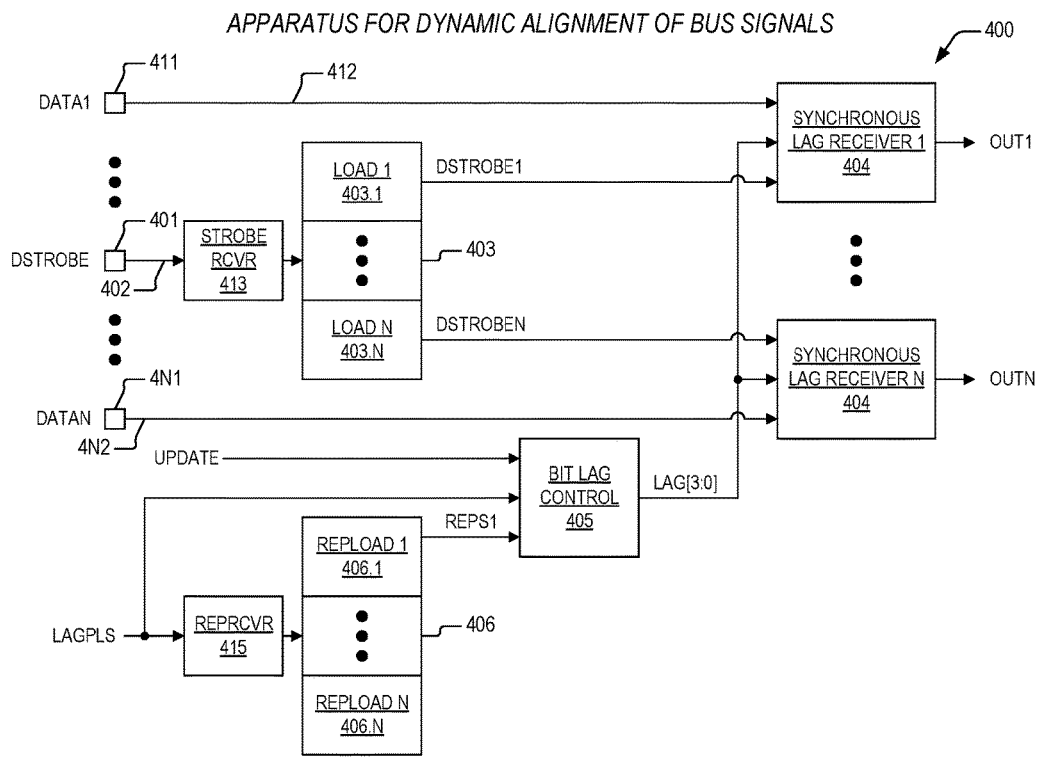

SOURCE SYNCHRONOUS DATA STROBE MISALIGNMENT COMPENSATION MECHANISM

CROSS-REFERENCE TO RELATED APPLICATIONS

This application is a continuation of U.S. patent application Ser. No. 13/747,038, filed on Jan. 22, 2013, which is herein incorporated by reference for all intents and purposes.

This application is related to the following U.S. Patent Applications, each of which has a common assignee and common inventors.

| SER. NO. | FILING DATE | TITLE |
| --- | --- | --- |
| 15/389,528 (CNTR.2539-C2) | Dec. 23, 2016 | SOURCE SYNCHRONOUS DATA STROBE MISALIGNMENT COMPENSATION MECHANISM |
| 13/747,140 (CNTR.2540) | Jan. 22, 2013 | APPARATUS AND METHOD FOR DYNAMIC ALIGNMENT OF SOURCE SYNCHRONOUS BUS SIGNALS |
| 13/747,187 (CNTR.2576) | Jan. 22, 2013 | SOURCE SYNCHRONOUS BUS SIGNAL ALIGNMENT COMPENSATION MECHANISM |
| 13/757,480 (CNTR.2581) | Feb. 1, 2013 | APPARATUS AND METHOD FOR AUTOMATICALLY ALIGNING DATA SIGNALS AND STROBE SIGNALS ON A SOURCE SYNCRHONOUS BUS |
| 15/389,538 (CNTR.2581-C1) | Dec. 23, 2016 | APPARATUS AND METHOD FOR AUTOMATICALLY ALIGNING DATA SIGNALS AND STROBE SIGNALS ON A SOURCE SYNCRHONOUS BUS |
| 15/389,544 (CNTR.2581-C2) | Dec. 23, 2016 | APPARATUS AND METHOD FOR AUTOMATICALLY ALIGNING DATA SIGNALS AND STROBE SIGNALS ON A SOURCE SYNCRHONOUS BUS |
| 13/757,575 (CNTR.2582) | Feb. 1, 2013 | APPARATUS AND METHOD FOR DYNAMICALLY ALIGNED SOURCE SYNCHRONOUS RECEIVER |
| 15/389,763 (CNTR.2582-C1) | Dec. 23, 2016 | APPARATUS AND METHOD FOR DYNAMICALLY ALIGNED SOURCE SYNCHRONOUS RECEIVER |
| 15/389,795 (CNTR.2582-C2) | Dec. 23, 2016 | APPARATUS AND METHOD FOR DYNAMICALLY ALIGNED SOURCE SYNCHRONOUS RECEIVER |

BACKGROUND OF THE INVENTION

Field of the Invention

This invention relates in general to the field of microelectronics, and more particularly to an apparatus and method for synchronizing and clocks and data related to the transmission and reception of source synchronous signals.

Description of the Related Art

A present day computer system employs a source synchronous system bus to provide for exchange of data between bus agents, such as between a microprocessor and a memory hub. A "source synchronous" bus protocol allows for the transfer of data at very high bus speeds. Source synchronous protocols operate on the principle that a transmitting bus agent places data out on the bus for a fixed time period and asserts or switches a "strobe" signal corresponding to the data to indicate to a receiving bus agent that the data is valid. Both data signals and their corresponding strobe are routed over the bus along equal propagation paths (both physically and electromagnetically), thus enabling a receiver to be relatively certain that when switching of the corresponding strobe is detected, data is valid on the data signals. For purposes of the present invention, a bus agent may be any electronic element that utilizes source synchronous signaling for the transfer of data to/from another bus agent over a source synchronous bus. Exemplary bus agents may be, but are not limited to, central processing units (CPUs), microprocessors, memory controllers, memory hubs, chipsets, and graphics controllers. The source synchronous bus may also be known as a system bus, a front side bus, or a back side bus. Bus agents may be individually packaged, disposed on a motherboard, and interconnected by conductive traces on the motherboard. Additionally, a plurality of bus agents may be disposed within the same package that is mounted to a motherboard, where the plurality of bus agents may be individual dies within the package or they may be integrated into the same integrated circuit die and are interconnected via traces on the die.

Yet, source synchronous data strobes and data signals are subject to error for a number of different reasons. These inaccuracies may be the result of uncontrollable design margins, fabrication tolerances, or environmental factors such as voltage or temperature. In most cases, it is desired that a strobe signal switch precisely halfway through a data validity period so that there is equal set up and hold time for the data as seen at the receiver. However, inaccuracies resulting from the above factors may result in skewing of the data signals and/or their strobes such that reception conditions are not optimum. Consequently, operating frequency of associated devices is limited.

Another source of error may be caused by distribution of a strobe signal within a receiving device. While system designers go to great lengths to ensure that a strobe and its associated data signals are routed along the same propagation path on a system board (or, motherboard), it is well known that once the strobe enters the receiving device, it must be distributed to all of the internal synchronous receivers that are associated with that strobe. Some techniques for distributing a strobe signal to internal receivers simply adds propagation lengths that are required to route the strobe to the internal receivers, which may add delay over that of the data signals, thereby skewing the phase of the synchronous transmission. More recent mechanisms for strobe distribution also introduce buffering of the disturbed strobe signals, thereby skewing the phase of the synchronous transmission even more.

Therefore, what is needed are apparatus and methods that compensate for misalignment of signals and strobes on a source synchronous data bus, thus allowing optimization of a device's operating frequency.

What is also needed is a technique that allows the signals on a synchronous bus to be optimized for reception by modifying the phase alignment of a data strobe and its corresponding data signals.

What is furthermore needed is an automatic mechanism that allows the phase alignment of a data strobe and its associated data signals to be dynamically optimized at a receiving device.

What is moreover needed is an apparatus that is programmable at the motherboard level to compensate for fabrication and design inaccuracies, voltage variations, and temperature variations in an automated signal alignment mechanism.

What is additionally needed is a synchronous receiver that automatically compensates for misalignment of signals on a source synchronous data bus.

SUMMARY OF THE INVENTION

The present invention, among other applications, is directed to solving the above-noted problems and addresses other problems, disadvantages, and limitations of the prior art. In addition, the present invention provides a superior technique for automatically and dynamically optimizing the phase alignment of data signals and associated strobes that are received over a source synchronous bus. In one embodiment, an apparatus is provided that compensates for misalignment on a synchronous data bus, the apparatus includes a replica radial distribution element, a bit lag control element, and a synchronous lag receiver. The replica radial distribution element is configured to receive a lag pulse signal, and is configured to generate a replicated strobe signal, where the replica radial distribution network includes replicated propagation path lengths, loads, and buffering of a radial distribution network for a strobe. The bit lag control element is configured to measure the time between assertion of the lag pulse signal and assertion of the replicated strobe signal, and is configured to generate a first value on a lag bus that indicates the time. The bit lag control element has delay lock control that is configured to select one of a plurality of successively delayed versions of the lag pulse signal that coincides with the assertion the replicated strobe signal, and is configured to generate a second value on a lag select bus that indicates the propagation time, where the delay lock control selects the one of a plurality of successively delayed versions of the lag pulse signal by incrementing and decrementing bus states of select inputs on a mux, and where the plurality of successively delayed versions comprises inputs to the mux, and where the plurality of successively delayed versions comprises outputs a first plurality of series-coupled matched inverter pairs. The synchronous lag receiver is coupled to the bit lag control element, and is configured to receive a first one of a plurality of radially distributed strobes and a data bit, and is configured to delay registering of the data bit by the time.

One aspect of the present invention contemplates an apparatus that compensates for misalignment on a synchronous data bus. The apparatus includes a microprocessor. The microprocessor has a replica radial distribution element, a bit lag control element, and a synchronous lag receiver. The replica radial distribution element is configured to receive a lag pulse signal, and is configured to generate a replicated strobe signal, where the replica radial distribution network includes replicated propagation path lengths, loads, and buffering of a radial distribution network for a strobe. The bit lag control element is configured to measure the time between assertion of the lag pulse signal and assertion of the replicated strobe signal, and is configured to generate a first value on a lag bus that indicates the time. The bit lag control element has delay lock control that is configured to select one of a plurality of successively delayed versions of the lag pulse signal that coincides with the assertion the replicated strobe signal, and is configured to generate a second value on a lag select bus that indicates the propagation time, where the delay lock control selects the one of a plurality of successively delayed versions of the lag pulse signal by incrementing and decrementing bus states of select inputs on a mux, and where the plurality of successively delayed versions comprises inputs to the mux, and where the plurality of successively delayed versions comprises outputs a first plurality of series-coupled matched inverter pairs. The synchronous lag receiver is coupled to the bit lag control element, and is configured to receive a first one of a plurality of radially distributed strobes and a data bit, and is configured to delay registering of the data bit by the time.

In another aspect, the present invention comprehends a method that compensates for misalignment on a synchronous data bus. The method includes: replicating propagation path length, loads, and buffering of a radial distribution network for a strobe, receiving a lag pulse signal, and generating a replicated strobe signal by employing the replicated propagation path lengths, loads, and buffering; measuring the time between assertion of the lag pulse signal and assertion of the replicated strobe signal, the measuring comprising: selecting one of a plurality of successively delayed versions of the lag pulse signal that coincides with assertion of the replicated strobe signal, where the selecting one of a plurality of successively delayed versions of the lag pulse signal comprises: incrementing and decrementing bus states of select inputs on a mux, where the plurality of successively delayed versions comprises inputs to the mux, and where the plurality of successively delayed versions comprises outputs a first plurality of series-coupled matched inverter pairs; on a lag bus, generating a value that indicates the propagation time; and within a synchronous lag receiver, receiving a first one of a plurality of radially distributed strobes and a data bit, and delaying registering of the data bit by the time.

Regarding industrial applicability, the present invention is implemented within a MICROPROCESSOR which may be used in a general purpose or special purpose computing device.

BRIEF DESCRIPTION OF THE DRAWINGS

These and other objects, features, and advantages of the present invention will become better understood with regard to the following description, and accompanying drawings where:

FIG. 3 is a block diagram featuring an apparatus for automated local synchronous signals alignment according to the present invention;

FIG. 4 is a block diagram showing an apparatus for automated dynamic synchronous signals alignment according to the present invention;

DETAILED DESCRIPTION

Figure 1:
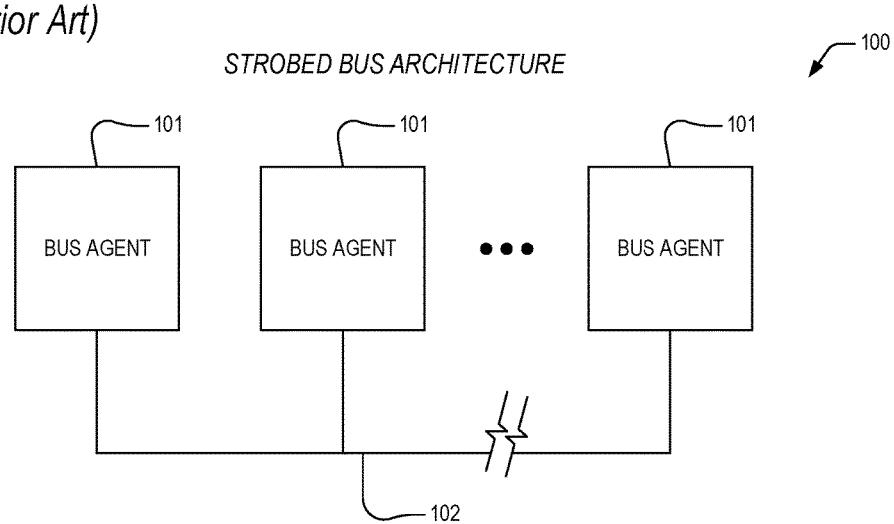
FIG. 1 is a block diagram illustrating a present day system wherein source synchronous data is transmitted and received.

Exemplary and illustrative embodiments of the invention are described below. In the interest of clarity, not all features of an actual implementation are described in this specification, for those skilled in the art will appreciate that in the development of any such actual embodiment, numerous implementation-specific decisions are made to achieve specific goals, such as compliance with system-related and business related constraints, which vary from one implementation to another. Furthermore, it will be appreciated that such a development effort might be complex and time-consuming, but would nevertheless be a routine undertaking for those of ordinary skill in the art having the benefit of this disclosure. Various modifications to the preferred embodiment will be apparent to those skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In view of the above background discussion on source synchronous signaling and associated techniques employed within present day devices for the transmission and reception of data, a discussion of the disadvantages and limitations of the present day techniques be discussed with reference to FIGS. 1-2. Following this, a discussion of the present invention will be presented with reference to FIGS. 3-9. The present invention overcomes these limitations and disadvantages by providing mechanisms that allow for the detection of the precise lag of a data strobe from associated data group bits in a receiving device and also techniques for delaying those associated data group bits in corresponding receivers thereby providing for correction of strobe and data misalignment caused by any of a number of reasons, thus enabling throughput to be optimized between the a transmitting device and a receiving device.

Turning to FIG. 1, a block diagram is presented illustrating a present day computer system 100 where two or more bus agents 101 exchange data over a source synchronous system bus 102. The bus agents 101 may be any element or elements of the computer system 100 that are employed to transmit or receive data via the bus 102, as is alluded to above. The source synchronous bus 102 may be known by other names as well including, but not limited to, a system bus, a front side bus, and a back side bus.

As one skilled in the art will appreciate, a typical present day bus agent 101 may be embodied as, but not limited to, a microprocessor or central processing unit (CPU), a memory hub or memory controller, a chipset, a master or slave peripheral device, a direct memory access unit, a graphics controller, or another type of bus interface unit. In broad terms, to transfer data, one of the bus agents 101 will drive a subset of the signals on the bus 102 while another of the bus agents 101 detects and receives the driven signals, thus capturing the data that is represented by the states of one or more of the subset of the signals on the bus 102. One or more of the bus agents 101 may be devices each disposed on an individual integrated circuit die and encapsulated in a device package, where the device package is disposed on a motherboard (or "system board") by conventional means, and where the system bus 102 is disposed as metal traces (or "lands") on the motherboard. Alternatively, two or more of the bus agents 101 may be devices each disposed on an individual integrated circuit die, where two or more of the integrated circuit die are disposed on a substrate and encapsulated in a single device package, and where the bus 102 is disposed as metal traces on the substrate, and where the single device package is disposed on a motherboard and is coupled to other device packages on the motherboard via interconnecting metal traces on the motherboard, where those interconnecting metal traces include the bus 102. Furthermore, two or more of the bus agents 101 may be disposed on a single integrated circuit die that is encapsulated in a device package that is disposed on a motherboard, where the system bus 102 comprises metal traces on the single integrated circuit die to interconnect the two or more bus agents 101, and also as metal traces on the motherboard to interconnect the device package housing the single integrated circuit die to other device packages disposed on the motherboard.

There are a number of different bus protocols provided for in the present day art for transferring data between two bus agents 101, and it is beyond the scope of this application to include a detailed description of these various techniques. It is sufficient for purposes of the present application to appreciate that the "data" which is communicated between two or more bus agents 101 during a bus transaction may include, but is not limited to, address information, data that is associated with one or more addresses, control information, or status information. Regardless of the type of data that is communicated over the bus 102, it is germane to this application that more and more present day computer systems 100 are employing a particular type of bus protocols commonly known as "source synchronous" protocols, to affect the transfer of data at very high bus speeds. In contrast to prior art sampled data bus protocols, source synchronous protocols operate on the principle that a transmitting bus agent 101 places data out on the bus 102 for a fixed time period (i.e., "setup time") and asserts a "strobe" signal corresponding to the data to indicate to a receiving bus agent 101 that the data is valid. The transmitting bus agent 101 holds the data on the bus 102 for an amount of time (i.e., "hold time") approximately equal to the setup time so that a receiving bus agent 101 can detect the state of the date prior to assertion of the strobe signal and to latch the data subsequent to assertion of the strobe signal. One skilled in the art will appreciate that the propagation path, to include physical and electromagnetic parameters, of one set of data and corresponding strobe signals, at very high transfer speeds, may very well be quite different from the propagation path that is associated with another set of signals on the bus, whether that propagation path is from the transmitting device to another receiving device or whether the propagation path is from the transmitting bus agent 101 to the same receiving bus agent 101, but corresponds to another data group and the group's associated strobe signal. In particular, propagation delay, bus impedance, and electromagnetic characteristics of a propagation path affect the times (i.e., the setup and hold times) at which the data signals are stable, (i.e., "valid") for reception by the receiving bus agent 101. It is for this reason that source synchronous bus protocols are now prominent in the market of fielded devices. In a typical configuration, a data strobe that is associated with a corresponding set (or "group") of data signals is purposely routed along the same propagation path as the set of data signals, and thus the strobe sees the same propagation characteristics as the data signals themselves. If the strobe is asserted during the period in which the data is valid (preferably such that setup and hold times are approximately equal), when the receiving bus agent 101 detects a valid transition of the strobe, it is relatively certain that the data signals will be valid as well.

Figure 2:
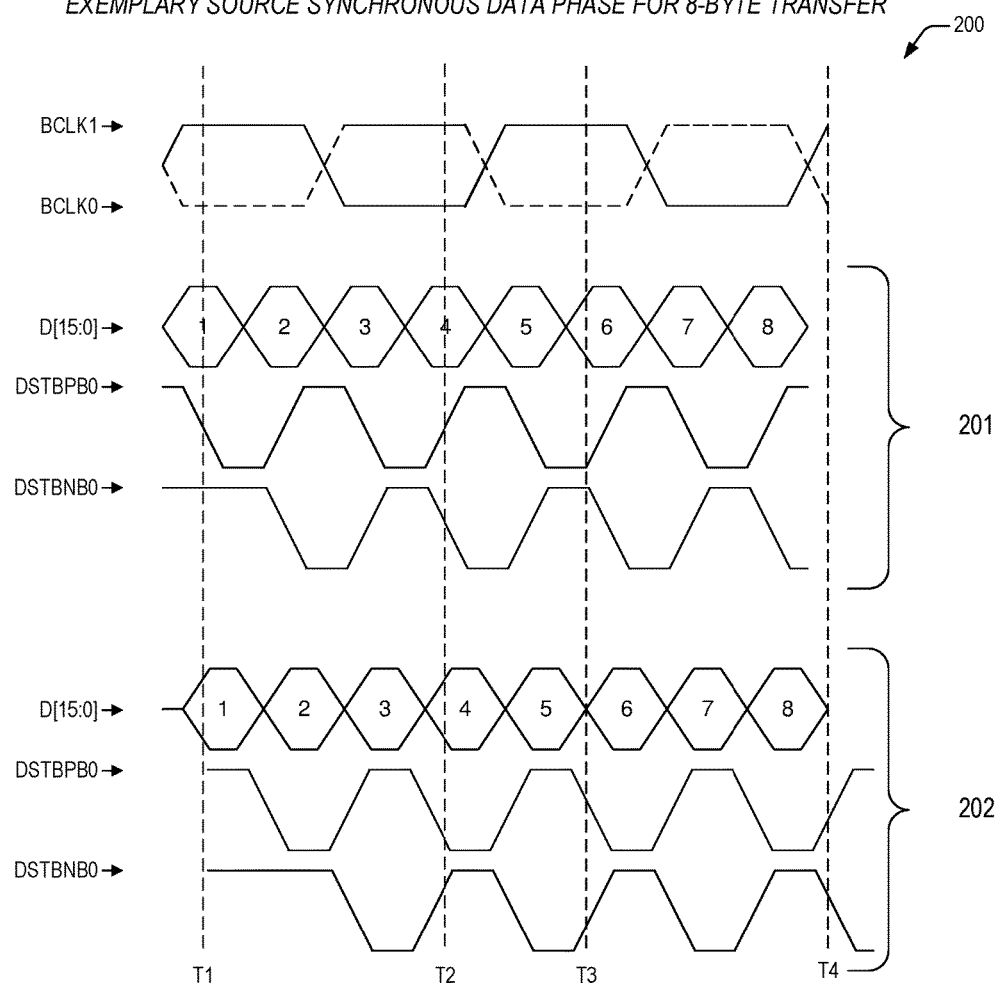
FIG. 2 is a timing diagram depicting two source synchronous signaling scenarios that may occur in the present day system of FIG. 1: one scenario in which a data strobe in a receiving device is in synchronization with associated data, and a second scenario in which the data strobe and the associated data are unsynchronized.

To more particularly describe the interaction of signals on a source synchronous bus, attention is now directed to FIG. 2, where is a timing diagram 200 is presented depicting two source synchronous signaling scenarios that may occur in the present day system of FIG. 1: one scenario in which a data strobe in a receiving device is in synchronization with associated data, and a second scenario in which the data strobe and the associated data are unsynchronized. The diagram 200 shows interaction of signals within an exemplary data signal group for performing the data phase of an 8-byte burst bus transaction. For clarity, assertion of signals is shown in the diagram 200 as a logic low level, although one skilled in the art will appreciate that assertion can as well be indicated by a logic high level, or by toggling between a high and low levels. Cycles of a differential bus clock BCLK[1:0] are shown across the top of the timing diagram 200. For an x86-compatible microprocessor, the bus clock BCLK[1:0] is distributed to all bus agents in order to facilitate synchronization of transactions between the bus agents.

A source synchronous protocol provides for a 16-bit data bus D[15:0] that supports transfer during the data phase of an 8-byte cache line over two cycles of the bus clock BCLK[1:0] through the employment of source synchronous data strobe signals DSTBPB0, DSTBNB0. The transfer of one byte over the 16-bit data bus D[15:0] is known as a beat, and 4 beats 1-4, 5-8 are transferred during each cycle of the bus clock BCLK[1:0]. The data bus signals D[15:0] and their corresponding strobe signals DSTBPB0, DSTBNB0 are routed along the same propagation path to individual bit receivers for each of the bits in D[15:0]. The falling edges of data strobe DSTBPB0 are used to indicate validity of words 1, 3, 5, and 7 on D[15:0]. The falling edges of data strobe DSTBNB0 are used to indicate validity of words 2, 4, 6, and 8 on D[15:0]. Note that the frequency of the data strobe signals DSTBPB0, DSTBNB0 is twice that of the bus clock BCLK[1:0] and that the two strobes DSTBPB0, DSTBNB0 exhibit a relative ½-cycle lag in phase. Consequently, the exemplary bus protocol supports transfer of four sets (i.e., beats) of data during a single bus clock cycle. The signals noted above are presented to teach aspects of the present invention, and for clarity sake bus interactions are simplified, however, as one skilled in the art will appreciate, the bus could be expanded to support any number of bits.

As one skilled in the art will acknowledge, a transmitting bus agent (e.g., microprocessor, chipset, or other bus agent) places its data D[15:0] on the bus and then asserts a corresponding data strobe DSTBPB0, DSTBNB0 to indicate validity of the data, preferably halfway through the validity period of the data so that setup and hold times are approximately equal. Hence, in contrast to older, sampled data/address buses, where data was placed on the bus and held for a sampling period, the present synchronous bus mechanisms strobe data out over bus subgroups in a plurality of bursts, where the validity of each burst is indicated by the state of the corresponding strobe DSTBPB0, DSTBNB0, and since the corresponding strobe DSTBPB0, DSTBNB0 is routed along the same propagation path as its associated data signals D[15:0], it is virtually certain that when a receiver detects assertion of the data strobe DSTBPB0, DSTBNB0, the associated data D[15:0] will be valid.

From the perspective of a receiving bus agent, assertions of the data/address strobes DSTBPB0, DSTBNB0 appear to be indeterminate with respect to assertions of the bus clock BCLK#, but as alluded to above, the period for each of the data strobes DSTBPB0, DSTBNB0 is equal to approximately one-half of the period of the bus clock BCLK#. As previously noted, the timing of data and strobe transitions is indeed a function of the bus clock frequency, but at a receiving bus agent the switching of any given data strobe seems, for all intents and purposes, to be asynchronous to the bus clock BCLK[1:0]. This is because there is a fixed, but unknown, phase difference between the bus clock BCLK[1:0] and transitions of the data subgroup signals and corresponding data strobes as the bus clock may BCLK[1:0] have traversed a different propagation path between a clock generator and the receiving bus agent.

Note that the transitions of D[15:0] and associated strobes DSTBPB0, DSTBNB0 in a first scenario 201 appear to be in phase with the transitions of BCLK[1:0] while the transitions of D[15:0] and associated strobes DSTBPB0, DSTBNB0 in a second scenario 202 appear to have no phase relationship with BCLK[1:0] whatsoever. These differences may be due to that manner in which a transmitting bus agent transfers data over the bus, or it may be due to a different propagation path length for the data bus D[15:0] relative to BCLK[1:0], or it may be due to both transmitter characteristics and propagation path lengths.

As long as the data signals within the bus D[15:0] are received approximately in proper phase with their corresponding strobe signals DSTBPB0, DSTBNB0, because setup and hold times are approximately equal, effective data transfer can be accomplished at very high bus speeds. This is the case illustrated the first scenario 201. Note that at time T1, from the perspective of the receiving bus agent, DSTBPB0 is asserted halfway through the period when burst 1 is valid on the bus, thus enabling optimum conditions for reception of the burst 1. Likewise, at time T2, from the perspective of the receiving bus agent DSTBNB0 is asserted halfway through the period when burst 4 is valid on the bus, thus enabling optimum conditions for reception of the burst 4.

The conditions in the first scenario 201, although desirable, are not realistic. This is because at the high speeds corresponding to a present day synchronous data bus, even the propagation paths and corresponding loads within a receiving device affect the relative skew of each of the data bits D[15:0] and their corresponding strobe signals DSTBPB0, DSTBNB0. In prior art designs, data bit signals and strobe signals were routed using brute force techniques such that the signals and strobes incurred the least amount of propagation path delay and loading that was possible on a die. And because each bit was individually routed to its receiver, the phase difference between data bit and strobe signal varied from receiver to receiver.

Because these individual propagation paths differ internal to a receiving device, designers often utilize a radial distribution scheme for the strobe where an equivalent propagation path (including loads and buffering) is applied to every distributed strobe signal. The result is that the phase lag between every data bit within the subgroup and their respective distributed strobe signal, as seen at a bit receiver, is approximately equal. Thus, radial distribution introduces phase lags into distributed strobe signals so that each of the receivers within a data group see the same amount of lag in their respective strobe signal relative to their corresponding data bit. Radial distribution schemes are very useful from a design standpoint because every data bit in a group sees the same phase lag for its corresponding strobe. However, the present inventors have observed that radial distribution limits the operating frequency of a device as a result of the lag that is introduced into the strobe signals. That is, setup times are much longer than hold times, which limits overall operating frequency.

This case is what is depicted for in the second scenario 202 for D[15:0], which for purposes of illustrating an extreme case, renders its associated data bit receivers inoperable. That is, because DSTBPB0 and DSTBNB0 are distributed to data bit receivers for bits D[15:0] within the receiving bus agent according to a radial distribution scheme, the amount of lag introduced into the distributed strobes causes the distributed strobes to be asserted when the data bits D[15:0] are no longer valid. Clearly, this is undesirable. Consider that at time T3, from the perspective of the bit receivers, DSTBPB0 is asserted when burst 5 is no longer valid on the bus, thus precluding any chance for reception of the burst 5. Likewise note that at time T4, DSTBNB0 is asserted when burst 8 is no longer valid on the bus, thus precluding any chance for reception of the burst 8.

In order to compensate for misalignment of a data bit and its corresponding data strobe, as noted above, various techniques are provided for in the art to introduce phase lag into data bits within a subgroup, or to accelerate assertion of data strobe signals, so that the signals (in the presence of radial strobe distribution) are optimally aligned. Yet, all of these mechanisms require experimentation, testing, circuitry external to a device, and/or programming of devices comprising a system on a motherboard. And the present inventors have noted that such experimentation, testing, circuitry, and/or programming is limiting in that each design must be uniquely configured to compensate for differences in the phase of a data strobe signal and its associated data bits, when the phase difference is chiefly due to radial distribution of the data strobe signal within a given receiving device.

In addition, the present inventors note that although the length of any particular propagation path for a strobe signal may be known, even in the presence of a radial distribution scheme, the timing of this path (and the resultant phase lag) will dynamically change as a result of voltage, temperature, and fabrication process variations. Consequently, to introduce a specified amount of phase delay into data bits within a subgroup, as is presently provided for by the prior art, is a suboptimal compensation technique at best.

The present invention overcomes the above noted limitations and disadvantages, and others, by providing a mechanism that automatically and dynamically aligns the phase of a data strobe and its associated data bit signals within a receiving device. The present invention dynamically adjusts the alignment of these signals as environmental factors (e.g., voltage, temperature, and process) change within a host device. The present invention will now be discussed with reference to FIGS. 3-9.

Referring now to FIG. 3, a block diagram is presented featuring an apparatus 300 for automated local synchronous signals alignment according to the present invention. The apparatus 300 is preferably disposed within a receiving device (e.g., "bus agent") that is coupled to a source synchronous bus, such as has been discussed above. In one embodiment, the receiving device comprises an x86-compatible microprocessor disposed as a die within an integrated circuit package that is physically coupled to a motherboard or system board. In another embodiment, the receiving device comprises an x86-compatible microprocessor configured as one or a plurality of x86-compatible microprocessors disposed on a single die within an integrated circuit package. One or more of the apparatuses 300 may be included within the receiving device to synchronize one or more data groups and their corresponding strobe signals, regardless of the type of data involved (e.g., data, address, or control). The apparatus 300 includes a radial distribution element 303 for a synchronous data strobe DSTROBE, as will be described below in further detail. The radial distribution element 303 equalizes all of the propagation paths (including loads and buffering) for DSTROBE as it is distributed. DSTROBE is received from a transmitting device (e.g., "bus agent") (not shown) as is described above.

The apparatus 300 may have a plurality of synchronous lag receivers 304 configured to receive one or more data bit signals DATA1-DATAN along with phase-aligned and load-matched strobe signals DSTROBE1-DSTROBN, which are derived from DSTROBE. A first one of the plurality of data signals DATA1 enters the receiving device at a first point 311 and a first signal 312 is routed to a first synchronous receiver 304. A last one of the plurality of data signals DATAN enters the device at a last point 3N1 and a last signal 3N2 is routed to its associated synchronous receiver 304. The receivers 304 output respective received data signals OUT1-OUTN.

The data strobe DSTROBE enters the device at point 301 where an internal strobe signal 302 is routed to a strobe receiver 313, which receives the strobe signal 302. The output of the strobe receiver 313 is coupled the radial distribution element 303. The radial distribution element 303 includes a plurality of delay elements 303.1-303.N, each associated with a corresponding one of the plurality of synchronous receivers 304. Each of the plurality of delay elements 303.1-303.N is configured to introduce a portion of a radial propagation path into the propagation path of DSTROBE as it is routed from the radial distribution element 303 to a corresponding receiver 304. In one embodiment, the radial propagation path may comprise a worst-case path in terms of load, trace length, and buffering that is associated with one of a plurality of distributed strobe signals DSTROBE1-DSTROBEN. The portion of the radial propagation path corresponding to a particular receiver 304 introduces additional propagation length, load, and buffering beyond the length, load, and buffering associated with the corresponding strobe signal DSTROBE1-DSTROBEN such that the cumulative length, load, and buffering for that corresponding strobe signal DSTROBE1-DSTROBEN is equal to the radial propagation path described above. Thus, from the perspective of a particular receiver 304, its corresponding data strobe signal DSTROBE1-DSTROBEN lags its corresponding data signal 321-3N2 in phase by the same amount as is seen by all other receivers 304 within a given data subgroup.

The apparatus 300 also includes bit lag control 305 that receives the data strobe signal 302, an update signal UPDATE, and one of the plurality of distributed data strobe signals DSTROBEN. In one embodiment, the bit lag control generates a 4-bit lag bus LAG[3:0] that indicates an amount of phase that the distributed strobe signals DSTROBE1-DSTROBEN lag behind the received data strobe signal DSTROBE. The lag bus LAG[3:0] is routed to each of the lag receivers 304 in the data subgroup.

Operationally, when UPDATE is asserted, the bit lag control 305 measures the lag between assertion of DSTROBE and assertion of DSTROBEN when DSTROBE is received by the receiving device, and the lag is indicated by the value of LAG[3:0]. The receivers 304 may register the value of LAG[3:0] and introduce an equal amount of lag into their corresponding data signals 312-3N2 during a following data cycle when DSTROBE is asserted. Thus, the amount of phase lag in the distributed data strobe signals DSTROBE1-DSTROBEN is updated at each data cycle and this lag is employed for a following data cycle, where each of the receivers 304 will introduce this same amount of delay into reception of their corresponding data signal 312-3N2, consequently centering assertion of the distributed data strobe signals DSTROBE1-DSTROBEN in a period when the data signals 312-3N2 are valid. Accordingly, the present invention delays each of the data signals 312-3N2 by an amount indicated by LAG[3:0] to provide for equal setup and hold times for each of the receivers 304, thus allowing higher frequency bus transactions than have heretofore been provided for.

A 4-bit lag bus LAG[3:0] is employed to provide an acceptable amount of resolution in the amount of lag delay, however higher or lower resolution may be achieved by increasing or decreasing the complexity of the bit lag control 305, the number of bits on the lag bus LAG[3:0], and the complexity of the receivers 304 to introduce lag.

Signal UPDATE may be deasserted for any number of well known reasons to include reset states, sleep states, power control, and the like. In one embodiment, when UPDATE is not asserted, the bit lag control 305 may not update the value of the lag bus LAG[3:0], and the former value is employed by the receivers 304 during all subsequent data cycles until UPDATE is again asserted.

As one skilled in the art will appreciate, the worst-case propagation path (and the resulting lag) dynamically changes as a function of temperature, voltage, operating frequency, and fabrication process variation (die-to-die variation and also point-to-point location variation on a die). Advantageously, since the amount of lag measured by the bit lag control 305 is replicated by each of the receivers 304, the value indicated by LAG[3:0] also dynamically adjusts as a function of the above noted attribute variations.

The apparatus 300 according to the present invention is configured to perform the functions and operations as discussed above. The apparatus 300 comprises logic, circuits, devices, or microcode, or a combination of logic, circuits, devices, or microcode, or equivalent elements that are employed to execute the functions and operations according to the present invention as noted. The elements employed to accomplish these operations and functions within the apparatus 300 may be shared with other circuits, microcode, etc., that are employed to perform other functions and/or operations within the receiving device.

The apparatus 300 provides a mechanism that directly measures the lag between a received strobe DSTROBE and its distributed strobe signals DSTROBE1-DSTROBEN, and thus provides a simple technique for compensating for radial strobe lag within a particular data subgroup. However, the present inventors have noted that alternative embodiments of the present invention may provide for a more timely dynamic adjustment of the lag by employing a replica radial distribution mechanism where the lag is measured offline. That is, according to the alternative embodiments, the lag may be measured and distributed to lag receivers asynchronous to when the synchronous bus is active. Accordingly, attention is now directed to FIG. 4, where a block diagram is presented showing an apparatus 400 for automated dynamic synchronous signals alignment according to the present invention.

The apparatus 400 is preferably disposed within a receiving device that is coupled to a source synchronous bus, such as has been discussed above. In one embodiment, the receiving device comprises an x86-compatible microprocessor disposed as a die within an integrated circuit package that is physically coupled to a motherboard or system board. In another embodiment, the receiving device comprises an x86-compatible microprocessor configured as one or a plurality of x86-compatible microprocessors disposed on a single die within an integrated circuit package. One or more of the apparatuses 400 may be included within the receiving device to synchronize one or more data groups and their corresponding strobe signals, regardless of the type of data involved (e.g., data, address, or control). Like the apparatus 300 discussed with reference to FIG. 3, the apparatus 400 of FIG. 4 includes a radial distribution element 403 for a synchronous data strobe DSTROBE, as will be described below in further detail. The radial distribution element 403 equalizes all of the propagation paths (including loads and buffering) for DSTROBE. DSTROBE is received from a transmitting bus agent (not shown) as described above.

The apparatus 400 has a plurality of synchronous lag receivers 404 configured to receive one or more data bit signals DATA1-DATAN along with phase-aligned and load-matched strobe signals DSTROBE1-DSTROBN, which are derived from DSTROBE. A first one of the plurality of data signals DATA1 enters the receiving device at a first point 411 and a first signal 412 is routed to a first synchronous receiver 404. A last one of the plurality of data signals DATAN enters the device at a last point 4N1 and a last signal 4N2 is routed to its associated synchronous receiver 404. The receivers 404 output respective received data signals OUT1-OUTN.

The data strobe DSTROBE enters the device at point 401 where an internal strobe signal 402 is routed to a strobe receiver 413, which receives the strobe signal 402. The output of the strobe receiver 413 is coupled the radial distribution element 403. The radial distribution element 403 includes a plurality of delay elements 403.1-403.N, each associated with a corresponding one of the plurality of synchronous receivers 404. Each of the plurality of delay elements 403.1-403.N is configured to introduce a portion of a radial propagation path into the propagation path of DSTROBE as it is routed from the radial distribution element 403 to a corresponding receiver 404. In one embodiment, the radial propagation path comprises a worst-case path in terms of load, trace length, and buffering that is associated with one of a plurality of distributed strobe signals DSTROBE1-DSTROBEN. The portion of the radial propagation path corresponding to a particular receiver 404 introduces additional propagation length, load, and buffering beyond the length, load, and buffering associated with the corresponding strobe signal DSTROBE1-DSTROBEN such that the cumulative length, load, and buffering for that corresponding strobe signal DSTROBE1-DSTROBEN is equal to the radial propagation path described above. Thus, from the perspective of a particular receiver 404, its corresponding data strobe signal DSTROBE1-DSTROBEN lags its corresponding data signal 412-4N2 in phase by the same amount as all other is seen by all other receivers 404 within a given data subgroup.

The apparatus 400 also includes a replica strobe receiver element (REPRCVR) 415, that receives a lag pulse signal LAGPLS. In one embodiment, LAGPLS may be an internal clock signal. The replica strobe receiver element 415 is a matched replica of the strobe receiver 413. The output of the replica receiver 415 is coupled to a replica radial distribution element 406 that is a replica of the radial distribution element 403, including a matched circuit configuration, propagation path lengths, loads, and buffering. The replica radial distribution element 406 includes a plurality of delay elements 406.1-406.N, each associated with a corresponding one of the plurality of synchronous receivers 404. Each of the plurality of delay elements 406.1-406.N is configured to introduce a portion of a radial propagation path into the propagation path of DSTROBE as it is routed from the radial distribution element 403 to a corresponding receiver 404. In one embodiment, the radial propagation path comprises a worst-case path in terms of load, trace length, and buffering that is associated with one of a plurality of distributed strobe signals DSTROBE1-DSTROBEN. In another embodiment, the replica radial distribution element 406 may comprise only one delay element 406.X, which replicates the worst-case path. One of the outputs REPS1 of the replica radial distribution element 406 is coupled to a bit lag control element 405, which generates an output lag bus LAG[3:0], and which is coupled to each of the receivers 404. An update signal UPDATE and LAGPLS are coupled as well to the bit lag control 405. In one embodiment, the bit lag control 405 generates a 4-bit lag bus LAG[3:0] that indicates an amount of phase that the output REPS1 lags behind LAGPLS. Since the combination of elements 415 and 406 completely replicates the propagation path exhibited by the strobe receiver 413 and radial distribution element 403, it is noted that the amount of phase lag indicated by LAG[3:0] represents the same phase lag that is exhibited by the strobe receiver 413 and the radial distribution element 403, and thus is substantially equivalent to the amount of phase that the distributed strobes DSTROBE1-DSTROBEN lag behind DSTROBE.

Operationally, when UPDATE is asserted, the bit lag control 405 measures the lag between assertion of LAGPLS and assertion of RESP1, and the lag is indicated by the value of LAG[3:0]. In one embodiment, LAGPLS is a continuous signal derived from a core processor clock signal (not shown). In one embodiment, UPDATE is asserted every 64 cycles of the core processor clock signal. Other embodiments are contemplated as well, with the express purpose of ensuring a timely update of LAG[3:0] without exhibiting a processing or power burden on remaining elements of a bus agent. The receivers 404 register the value of LAG[3:0] and introduce an equal amount of lag into their corresponding data signals 412-4N2 during a next data cycle when DSTROBE is asserted. Thus, the amount of phase lag in the distributed data strobe signals DSTROBE1-DSTROBEN is updated at each data cycle, as replicated by pulsing LAGPLS through the replica receiver 415 and distribution element 406, and this lag is employed for a next data cycle and all data cycles occurring until the next periodic update of LAG[3:0], where each of the receivers 404 will introduce this same amount of delay into reception of their corresponding data signal 412-4N2, consequently centering assertion of the distributed data strobe signals DSTROBE1-DSTROBEN in a period when the data signals 412-4N2 are valid. Accordingly, the present invention delays each of the data signals 412-4N2 by an amount indicated by LAG[3:0] to provide for equal setup and hold times for each of the receivers 404, thus allowing higher frequency bus transactions than have heretofore been provided for.

In contrast to the local alignment apparatus 300 of FIG. 3, the dynamic alignment apparatus 400 of FIG. 4 does not depend upon assertion of DSTROBE in order to measure and indicate how much a distributed strobe DSTROBE1-DSTROBEN will lag behind the data strobe DSTROBE.

The 4-bit lag bus LAG[3:0] is employed to provide an acceptable amount of resolution in the amount of lag delay, however higher or lower resolution may be achieved by increasing or decreasing the complexity of the bit lag control 405, the number of bits on the lag bus LAG[3:0], and the complexity of the receivers 404.

Signal UPDATE may be deasserted for any number of well known reasons to include reset states, sleep states, power control, and the like. When UPDATE is not asserted, the bit lag control 405 does not update the value of the lag bus LAG[3:0], and the former value is employed by the receivers 404 during subsequent data cycles.

The apparatus 400 according to the present invention is configured to perform the functions and operations as discussed above. The apparatus 400 comprises logic, circuits, devices, or microcode, or a combination of logic, circuits, devices, or microcode, or equivalent elements that are employed to execute the functions and operations according to the present invention as noted. The elements employed to accomplish these operations and functions within the apparatus 400 may be shared with other circuits, microcode, etc., that are employed to perform other functions and/or operations within the receiving device.

Figure 5:
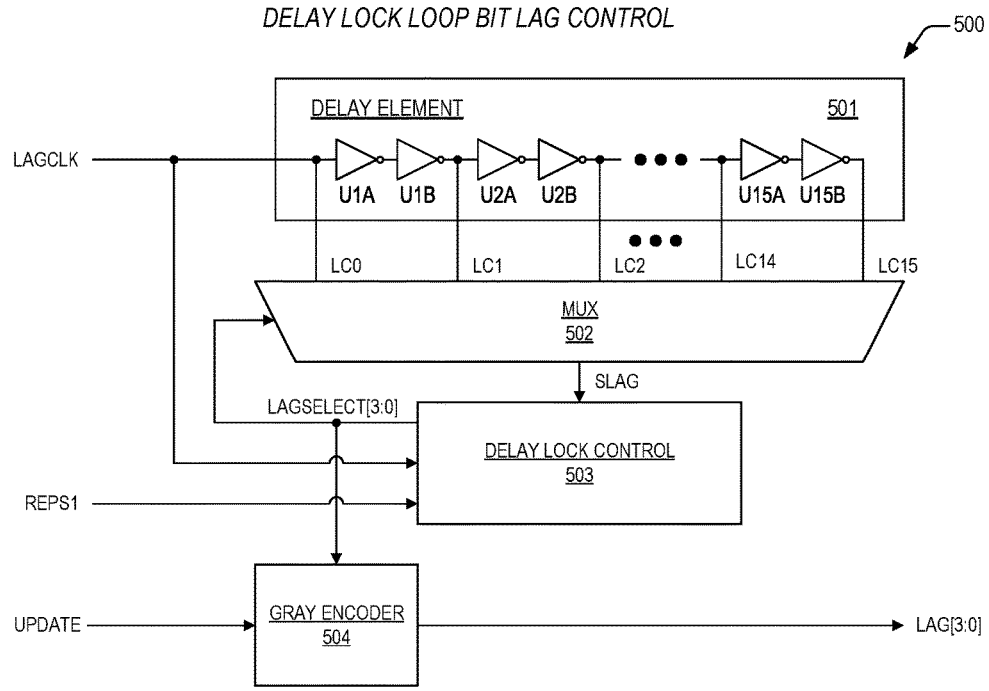
FIG. 5 is a block diagram one embodiment of a bit lag control element according to the present invention.

Turning to FIG. 5, a block diagram is presented detailing one embodiment of a bit lag control element 500 according to the present invention. The bit lag control 500 may be employed in the embodiments of FIGS. 3 and 4. The bit lag control 500 includes a delay element 501 that is coupled to a mux 502. The mux 502 is coupled to delay lock control 503 via signal SLAG. The delay lock control 503 generates a 4-bit lag select signal LAGSELECT[3:0] that is coupled to the mux 502 and to a gray encoder 504. An update signal UPDATE is coupled to the gray encoder 504, which generates a gray-encoded 4-bit lag signal LAG[3:0] indicating the number of matched inverter pairs U1A/B-U15A/B that a radially distributed pulse RESP1 lags behind a lag clock pulse LAGCLK.

The delay element 501 and the delay lock control 503 receive the lag clock LAGCLK. The delay lock control 503 also receives the distributed lag clock REPS1. In the embodiment of FIG. 3, LAGCLK is represented by signal DSTROBE and REPS1 is represented by DSTROBEN. In the apparatus 400 of FIG. 4, LAGCLK is represented by LAGPLS and REPS1 is represented by the like-named signal. The delay element 501 includes a plurality of inverter pairs U1A/B-U15A/B. A tap LC0-LC15 is coupled to each of the pairs U1A/B-U15A/B, and the taps LC0-LC15 are coupled to the register mux 502. In the embodiment of FIG. 5, 15 inverter pairs U1A/B-U15A/B are depicted having matched inverters U1A/B-U15A/B each exhibiting a delay of 20 picoseconds per inverter U1A/B-U15A/B (40 picoseconds per inverter pair U1A/B-U15A/B, which is acceptable resolution for measuring phase lag in a receiving device operating at but speeds from approximately 500 Megahertz to 1.5 Gigahertz. Other embodiments are contemplated comprising different numbers of inverter pairs U1A/B-U15A/B as is appropriate with the application. An inverter pair U1A/B-U15A/B exhibiting a 40 picosecond delay is commensurate with receiving devices fabricated according to a 28-nanometer CMOS fabrication process and operating within the aforementioned frequency range. It is noted that the configuration shown in FIG. 5 is presented to teach the present invention and that modifications can be made to provide accuracy and resolution under different fabrication processes and different operating frequencies.

As noted above, the gray encoder 504 generates a gray-encoded bus LAG[3:0] that indicates the amount of time that RESP1 lags in phase behind LAGCLK, which is the amount of time that it takes for a data strobe to propagate through a radial distribution network up to a data bit receiver according to the present invention.

In operation, UPDATE enables or disables operation of the bit lag control 500, as has been described above. When UPDATE is asserted, upon assertion of LAGCLK, successively delayed versions of LAGCLK are generated by the delay element 501 and are provided on taps LC0-LC15 to the mux 502. The delay lock control increments or decrements the value of LAGSELECT[3:0] in order to select one of the taps LC0-LC15 on signal SLAG such that the value of SLAG is equal to RESP1 subsequent to assertion of LAGCLK. Thus, the delay lock control 503 operates substantially similar to a delay lock loop in order to converge on a phase delay that is one inverter pair U1A/B-U15A/B less than the delay corresponding to one of the inverter pairs U1A/B-U15A/B. In one embodiment, to provide for stability of the bit lag control 500, once a phase lag is locked in place, the delay lock control increments/decrements LAGSELECT[3:0] about the selected value such that changes of measured delay vary only by one bit.

In one embodiment, measurement of the phase lag operates independently and asynchronously from assertion of the update signal UPDATE. When UPDATE is asserted, the gray-encoded value of LAGSELECT[3:0] is placed on bus LAG[3:0]. Accordingly, a 4-bit value of 0011 on LAGSELECT[3:0] may indicate that RESP1 lags behind LAGCLK by 120 picoseconds under certain temperature, voltage, and frequency conditions. But since the present invention is configured to provide for automatic and dynamic measurement of phase lag and adjustment of the same timing in a data bit receiver, it is more precise to state that the above noted value of LAGSELECT[3:0] indicates that RESP1 lags behind LAGCLK by three inverter pairs U1A/B-U15A/B. Since matched replicas of these inverter pairs U1A/B-U15A/B are present in every data bit receiver according to the present invention, this phase "delay" can be replicated at each of the data bit receivers to provide for optimum reception of data.

The gray-encoded 4-bit lag bus LAG[3:0] is distributed to each of the data bit receivers that are associated with the radial distribution network being measured. Typically, these will comprise all of the data bit receivers in a particular data subgroup that each are activated by the same synchronous data strobe signal. In one embodiment, a different bit lag control 500 is employed for each different radial distribution network. In alternative embodiments, the gray encoder 504 may be deleted and the lag select bus LAGSELECT[3:0] is sent directly to the receivers. In such alternative embodiments, provisions must be made to accommodate glitches in LAGSELECT[3:0].

The apparatus 500 according to the present invention is configured to perform the functions and operations as discussed above. The apparatus 500 comprises logic, circuits, devices, or microcode, or a combination of logic, circuits, devices, or microcode, or equivalent elements that are employed to execute the functions and operations according to the present invention as noted. The elements employed to accomplish these operations and functions within the apparatus 500 may be shared with other circuits, microcode, etc., that are employed to perform other functions and/or operations within the receiving device.

Figure 6:
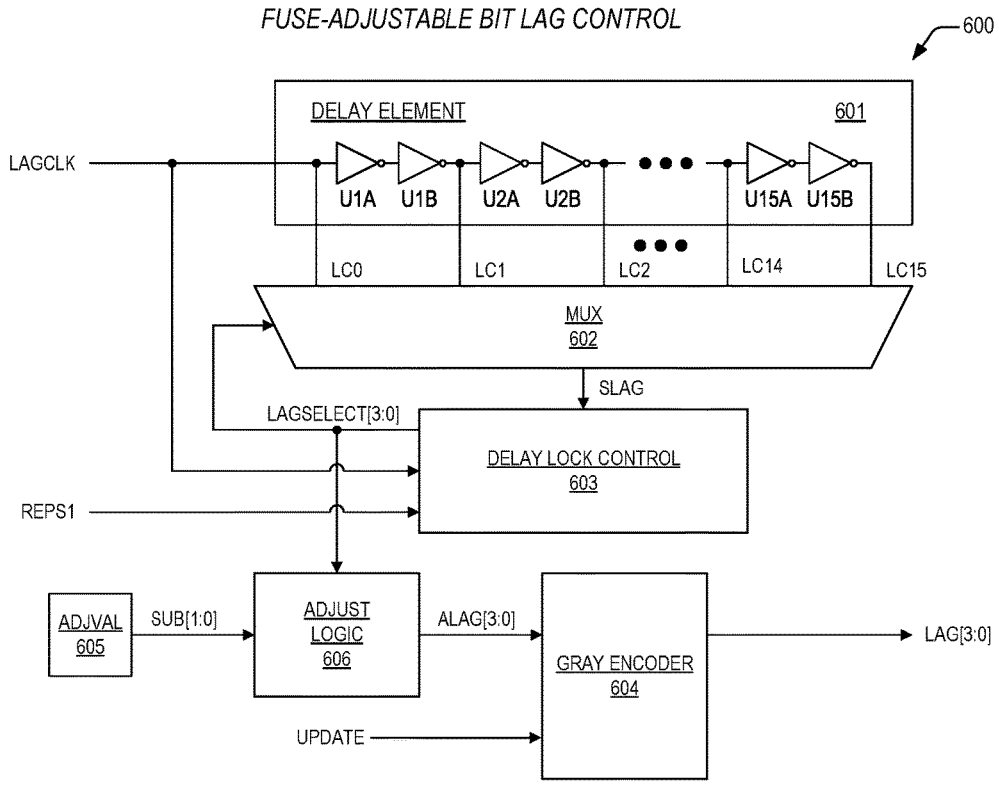
FIG. 6 is a block diagram showing a fuse-adjustable bit lag control element according to the present invention.

Now turning to FIG. 6, a block diagram is presented showing a fuse-adjustable bit lag control element 600 according to the present invention. The bit lag control element 600 is provided to enable the amount of delay indicated by a delay lock control element 603 via LAGSELECT[3:0] in such a manner as to provide compensation for lot variations, process variations, and other factors that may come to light during or following manufacture of a host device. The bit lag control 600 may be employed in the embodiments of FIGS. 3 and 4. The bit lag control 600 includes a delay element 601 that is coupled to a mux 602. The mux 602 is coupled to delay lock control 603 via signal SLAG. The delay lock control 603 generates a 4-bit lag select signal LAGSELECT[3:0] that is coupled to the mux 602 and to adjust logic 606. The adjust logic 606 is coupled to a gray encoder 604. The adjust logic 606 is also coupled to an adjust value ADJVAL 605 via bus SUB[1:0]. An update signal UPDATE is coupled to the gray encoder 604, which generates a gray-encoded 4-bit lag signal LAG[3:0] indicating the number of matched inverter pairs U1A/B-U15A/B that a radially distributed pulse RESP1 lags behind a lag clock pulse LAGCLK, as adjusted by the value indicated on SUB[1:0].

The delay element 601 and the delay lock control 603 receive the lag clock LAGCLK. The delay lock control 603 also receives the distributed lag clock REPS1. In the embodiment of FIG. 3, LAGCLK is represented by signal DSTROBE and REPS1 is represented by DSTROBEN. In the apparatus 400 of FIG. 4, LAGCLK is represented by LAGPLS and REPS1 is represented by the like-named signal. The delay element 601 includes a plurality of inverter pairs U1A/B-U15A/B. A tap LC0-LC15 is coupled to each of the pairs U1A/B-U15A/B, and the taps LC0-LC15 are coupled to the register mux 602. In the embodiment of FIG. 6, 15 inverter pairs U1A/B-U15A/B are depicted having matched inverters U1A/B-U15A/B each exhibiting a delay of 20 picoseconds per inverter U1A/B-U15A/B (40 picoseconds per inverter pair U1A/B-U15A/B, which is acceptable resolution for measuring phase lag in a receiving device operating at but speeds from approximately 500 Megahertz to 1.5 Gigahertz. Other embodiments are contemplated comprising different numbers of inverter pairs U1A/B-U15A/B as is appropriate with the application.

The gray encoder 604 generates a gray-encoded bus LAG[3:0] that indicates the amount of time that RESP1 lags in phase behind LAGCLK, as adjusted by the value of bus ALAG[3:0], which is an adjusted amount of time that it takes for a data strobe to propagate through a radial distribution network up to a data bit receiver according to the present invention.

In operation, UPDATE enables or disables operation of the bit lag control 600, as has been described above. When UPDATE is asserted, upon assertion of LAGCLK, successively delayed versions of LAGCLK are generated by the delay element 601 and are provided on taps LC0-LC15 to the mux 602. The delay lock control increments or decrements the value of LAGSELECT[3:0] in order to select one of the taps LC0-LC15 on signal SLAG such that the value of SLAG is equal to RESP1 subsequent to assertion of LAGCLK. Thus, the delay lock control 603 operates substantially similar to a delay lock loop in order to converge on a phase delay that is one inverter pair U1A/B-U15A/B less than the delay corresponding to one of the inverter pairs U1A/B-U15A/B. In one embodiment, to provide for stability of the bit lag control 600, once a phase lag is locked in place, the delay lock control increments/decrements LAGSELECT[3:0] about the selected value such that changes of measured delay vary only by one bit.

In operation, the adjust logic 606 that receives a compensation value over bus SUB[1:0] and performs a subtraction function, in one embodiment, from LAGSELECT[3:0]. The amount to be subtracted from LAGSELECT[3:0] is indicated by the value of signal SUB[1:0], which is received from the ADJVAL logic 605. In one embodiment, SUB[1:0] indicates a number of bits to right shift the valued of LAGSELECT[3:0]. Then the right-shifted version of LAGSELECT[3:0] is subtracted from LAGSELECT[3:0] by the adjust logic 606 to produce an adjusted 4-bit vector ALAG[3:0]. In one embodiment, the number of bits to right shift LAGSELECT[3:0] is as shown below in Table 1.

TABLE 1

Adjustment Values for 4-Bit Select Vector

| SUB[1:0] VALUE | NUMBER OF BITS TO RIGHT SHIFT |
|---|---|
| 00 | 0 BITS |
| 01 | 1 BIT |
| 10 | 2 BITS |
| 11 | 3 BITS |

In one embodiment, the ADJVAL logic 605 comprises one or more metal or poly fuses which are blown during fabrication of the device or IC. An alternative embodiment contemplates the ADJVAL logic circuit 606 as programmable, read-only memory located on the device or IC. A further alternative embodiment comprehends ADJVAL logic 605 that is located off the device or IC and that provides SUB[1:0] as signals to I/O pins (not shown) on the device or IC. Other embodiments of the ADJVAL logic 605 are contemplated as well, to include, but not limited to, a number of signals of bus SUB which are more or less than two signals. By providing the ADJVAL logic circuit 605 and the adjust logic circuit 606, a designer is allowed to tweak the amount of delay indicated by the delay lock control 603 via LAGSELECT[3:0] in such a manner as to provide compensation for lot variations, process variations, and other factors that may come to light during or following manufacture of the IC. The adjust logic 606 thus generates an adjusted 4-bit select vector ALAG[3:0] by subtracting a right-shifted value of LAGSELECT[3:0] from LAGSELECT[3:0] as indicated by SUB[1:0].

In one embodiment, measurement of the phase lag operates independently and asynchronously from assertion of the update signal UPDATE. When UPDATE is asserted, the gray-encoded value of ALAG[3:0] is placed on bus LAG[3:0]. Accordingly, a 4-bit value of 0011 on LAGSELECT[3:0] may indicate that RESP1 lags behind LAGCLK by 120 picoseconds under certain temperature, voltage, and frequency conditions. But since the present invention is configured to provide for automatic and dynamic measurement of phase lag and adjustment of the same timing in a data bit receiver, it is more precise to state that the above noted value of LAGSELECT[3:0] indicates that RESP1 lags behind LAGCLK by three inverter pairs U1A/B-U15A/B. Since matched replicas of these inverter pairs U1A/B-U15A/B are present in every data bit receiver according to the present invention, this phase "delay" can be replicated at each of the data bit receivers to provide for optimum reception of data. A value of 01 on SUB[1:0] indicates to the adjust logic 606 to right shift the value of LAGSELECT[3:0] by one bit and subtract this right shifted value (i.e., 0001) from the true value of LAGSELECT[3:0] (i.e., 0011), yielding a value of LAG[3:0] of 0010, which indicates that RESP1 lags behind LAGCLK by only 80 picoseconds, as opposed to the 120-picosecond lag indicated by LAGSELECT[3:0].

The gray-encoded 4-bit lag bus LAG[3:0] is distributed to each of the data bit receivers that are associated with the radial distribution network being measured. Typically, these will comprise all of the data bit receivers in a particular data subgroup that each are activated by the same synchronous data strobe signal. In one embodiment, a different bit lag control 600 is employed for each different radial distribution network. In alternative embodiments, the gray encoder 604 may be deleted and the adjusted lag select bus ALAG[3:0] is sent directly to the receivers. In such alternative embodiments, provisions must be made to accommodate glitches in LAGSELECT[3:0].

The apparatus 600 according to the present invention is configured to perform the functions and operations as discussed above. The apparatus 600 comprises logic, circuits, devices, or microcode, or a combination of logic, circuits, devices, or microcode, or equivalent elements that are employed to execute the functions and operations according to the present invention as noted. The elements employed to accomplish these operations and functions within the apparatus 600 may be shared with other circuits, microcode, etc., that are employed to perform other functions and/or operations within the receiving device.

Figure 7:
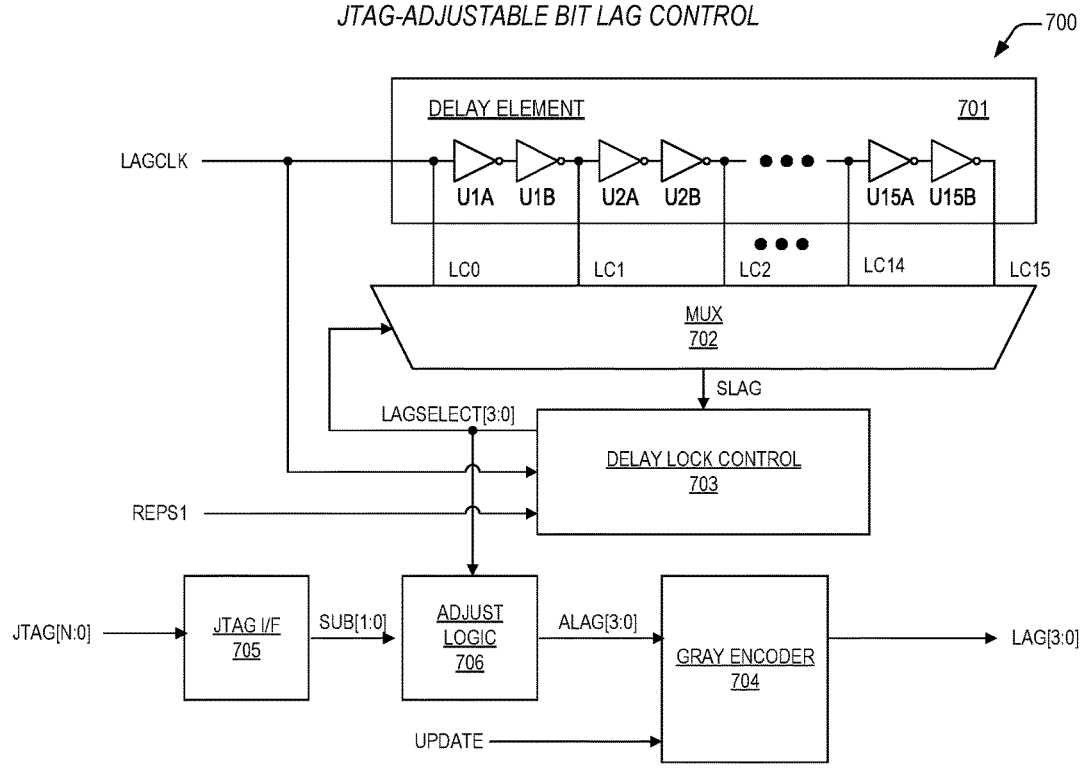
FIG. 7 is a block diagram illustrating a JTAG-adjustable bit lag control element according to the present invention.

Now turning to FIG. 7, a block diagram is presented showing a JTAG-adjustable bit lag control element 700 according to the present invention. The bit lag control element 700 is provided to enable the amount of delay indicated by a delay lock control element 703 via LAGSELECT[3:0] in such a manner as to provide compensation for lot variations, process variations, and other factors that may come to light during or following manufacture of a host device. The bit lag control 700 may be employed in the embodiments of FIGS. 3 and 4. The bit lag control 700 includes a delay element 701 that is coupled to a mux 702. The mux 702 is coupled to delay lock control 703 via signal SLAG. The delay lock control 703 generates a 4-bit lag select signal LAGSELECT[3:0] that is coupled to the mux 702 and to adjust logic 706. The adjust logic 706 is coupled to a gray encoder 704. The adjust logic 706 is also coupled to a Joint Test Action Group (JTAG) interface 705 via bus SUB[1:0]. The JTAG interface 705 receives control information over a standard JTAG bus JTAG[N:0] that provides information applicable for the adjustment of the delay determined by the delay lock control 703. An update signal UPDATE is coupled to the gray encoder 704, which generates a gray-encoded 4-bit lag signal LAG[3:0] indicating the number of matched inverter pairs U1A/B-U15A/B that a radially distributed pulse RESP1 lags behind a lag clock pulse LAGCLK, as adjusted by the value indicated on SUB[1:0].

The delay element 701 and the delay lock control 703 receive the lag clock LAGCLK. The delay lock control 703 also receives the distributed lag clock REPS1. In the embodiment of FIG. 3, LAGCLK is represented by signal DSTROBE and REPS1 is represented by DSTROBEN. In the apparatus 400 of FIG. 4, LAGCLK is represented by LAGPLS and REPS1 is represented by the like-named signal. The delay element 701 includes a plurality of inverter pairs U1A/B-U15A/B. A tap LC0-LC15 is coupled to each of the pairs U1A/B-U15A/B, and the taps LC0-LC15 are coupled to the register mux 702. In the embodiment of FIG. 7, 15 inverter pairs U1A/B-U15A/B are depicted having matched inverters U1A/B-U15A/B each exhibiting a delay of 20 picoseconds per inverter U1A/B-U15A/B (40 picoseconds per inverter pair U1A/B-U15A/B, which is acceptable resolution for measuring phase lag in a receiving device operating at but speeds from approximately 500 Megahertz to 1.5 Gigahertz. Other embodiments are contemplated comprising different numbers of inverter pairs U1A/B-U15A/B as is appropriate with the application.

The gray encoder 704 generates a gray-encoded bus LAG[3:0] that indicates the amount of time that RESP1 lags in phase behind LAGCLK, as adjusted by the value of bus ALAG[3:0], which is an adjusted amount of time that it takes for a data strobe to propagate through a radial distribution network up to a data bit receiver according to the present invention.

In operation, UPDATE enables or disables operation of the bit lag control 700, as has been described above. When UPDATE is asserted, upon assertion of LAGCLK, successively delayed versions of LAGCLK are generated by the delay element 701 and are provided on taps LC0-LC15 to the mux 702. The delay lock control increments or decrements the value of LAGSELECT[3:0] in order to select one of the taps LC0-LC15 on signal SLAG such that the value of SLAG is equal to RESP1 subsequent to assertion of LAGCLK. Thus, the delay lock control 703 operates substantially similar to a delay lock loop in order to converge on a phase delay that is one inverter pair U1A/B-U15A/B less than the delay corresponding to one of the inverter pairs U1A/B-U15A/B. In one embodiment, to provide for stability of the bit lag control 700, once a phase lag is locked in place, the delay lock control increments/decrements LAGSELECT[3:0] about the selected value such that changes of measured delay vary only by one bit.

In operation, well-known JTAG programming techniques are employed to program the precise amount of compensation that is indicated over SUB[1:0]. Such programming is performed when a host device is in a state where JTAG programming is allowed, such as a RESET state. Upon exit from the state, bus SUB[1:0] indicates a compensation value. As with the embodiment 700 of FIG. 7, the adjust logic 706 that receives the compensation value over bus SUB[1:0] and performs a subtraction function, in one embodiment, from LAGSELECT[3:0]. The amount to be subtracted from LAGSELECT[3:0] is indicated by the value of signal SUB[1:0]. In one embodiment, SUB[1:0] indicates a number of bits to right shift the valued of LAGSELECT[3:0]. Then the right-shifted version of LAGSELECT[3:0] is subtracted from LAGSELECT[3:0] by the adjust logic 706 to produce an adjusted 4-bit vector ALAG[3:0]. In one embodiment, the number of bits to right shift LAGSELECT[3:0] is as shown below in Table 2.

TABLE 2

Adjustment Values for 4-Bit Select Vector

| SUB[1:0] VALUE | NUMBER OF BITS TO RIGHT SHIFT |
|---|---|
| 00 | 0 BITS |
| 01 | 1 BIT |
| 10 | 2 BITS |
| 11 | 3 BITS |

Other embodiments of the JTAG interface 705 are contemplated, including, but not limited to, a number of signals of bus SUB which are more or less than two signals. By providing the JTAG interface 707 and the adjust logic circuit 706, a designer is allowed to tweak the amount of delay indicated by the delay lock control 703 via LAGSELECT[3:0] in such a manner as to provide compensation for lot variations, process variations, and other factors that may come to light during or following manufacture of the IC. The adjust logic 706 thus generates an adjusted 4-bit select vector ALAG[3:0] by subtracting a right-shifted value of LAGSELECT[3:0] from LAGSELECT[3:0] as indicated by SUB[1:0].

In one embodiment, measurement of the phase lag operates independently and asynchronously from assertion of the update signal UPDATE. When UPDATE is asserted, the gray-encoded value of ALAG[3:0] is placed on bus LAG[3:0]. Accordingly, a 4-bit value of 0011 on LAGSELECT[3:0] may indicate that RESP1 lags behind LAGCLK by 120 picoseconds under certain temperature, voltage, and frequency conditions. But since the present invention is configured to provide for automatic and dynamic measurement of phase lag and adjustment of the same timing in a data bit receiver, it is more precise to state that the above noted value of LAGSELECT[3:0] indicates that RESP1 lags behind LAGCLK by three inverter pairs U1A/B-U15A/B. Since matched replicas of these inverter pairs U1A/B-U15A/B are present in every data bit receiver according to the present invention, this phase "delay" can be replicated at each of the data bit receivers to provide for optimum reception of data. A value of 01 on SUB[1:0] indicates to the adjust logic 706 to right shift the value of LAGSELECT[3:0] by one bit and subtract this right shifted value (i.e., 0001) from the true value of LAGSELECT[3:0] (i.e., 0011), yielding a value of LAG[3:0] of 0010, which indicates that RESP1 lags behind LAGCLK by only 80 picoseconds, as opposed to the 120-picosecond lag indicated by LAGSELECT[3:0].

The gray-encoded 4-bit lag bus LAG[3:0] is distributed to each of the data bit receivers that are associated with the radial distribution network being measured. Typically, these will comprise all of the data bit receivers in a particular data subgroup that each are activated by the same synchronous data strobe signal. In one embodiment, a different bit lag control 700 is employed for each different radial distribution network. In alternative embodiments, the gray encoder 704 may be deleted and the adjusted lag select bus ALAG[3:0] is sent directly to the receivers.

The apparatus 700 according to the present invention is configured to perform the functions and operations as discussed above. The apparatus 700 comprises logic, circuits, devices, or microcode, or a combination of logic, circuits, devices, or microcode, or equivalent elements that are employed to execute the functions and operations according to the present invention as noted. The elements employed to accomplish these operations and functions within the apparatus 700 may be shared with other circuits, microcode, etc., that are employed to perform other functions and/or operations within the receiving device.

Figure 8:
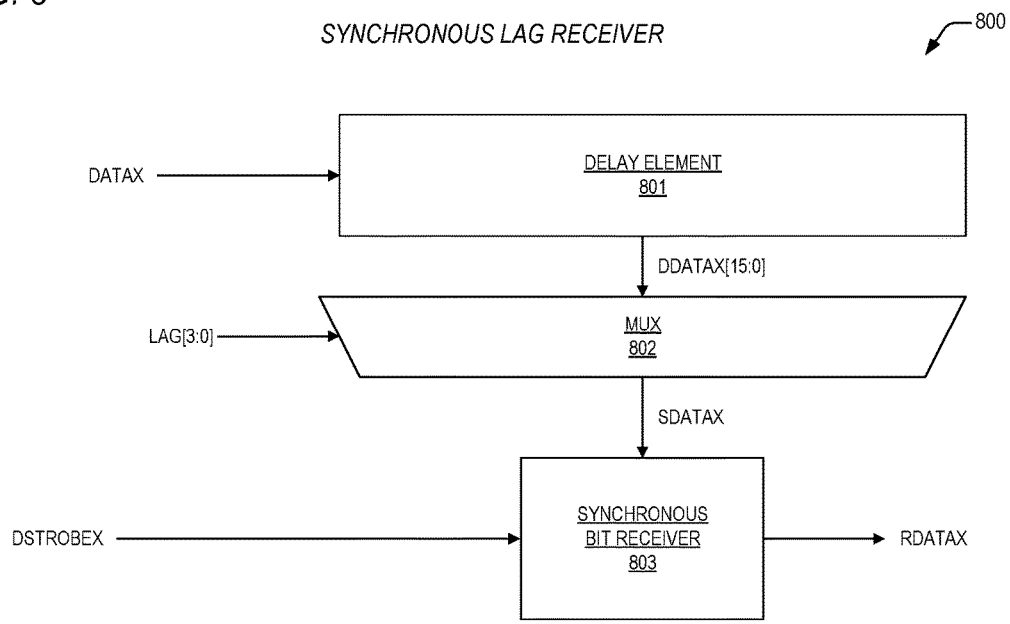
FIG. 8 is a block diagram depicting a synchronous lag receiver according to the present invention.

Referring now to FIG. 8, a block diagram is presented depicting a synchronous lag receiver 800 according to the present invention. The receiver 800 may be employed in the embodiments of FIGS. 3-4 and functions to introduce a delay into the propagation path of a data bit DATAX that is received from a transmitting device, where the delay is indicated by the value of a lag bus LAG[3:0] that is updated by a bit lag control element according to the present invention, such as is described above with reference to FIGS. 3-8. The receiver 800 includes a delay element 801 that receives the data bit DATAX. The delay element 801 is coupled to a mux 802 via a delayed data bit bus DDATAX [15:0]. The lag bus LAG[3:0] is coupled to the mux 802. The mux 802 is coupled to a synchronous bit receiver 804 via a selected delayed data signal SDATAX. The bit receiver 804 receives SDATAX and a data strobe DSTROBEX. DSTROBEX is distributed from a radial distribution element 303, 403, such as is discussed above with reference to FIGS. 3-4. The bit receiver 804 generates a received data bit signal RDATAX.

Operationally, a bit lag controller according to the present invention updates the value of LAG[3:0] to position reception of DATAX optimally in relation to the phase of DSTROBEX. In one embodiment, this positioning is such that DSTROBEX switches approximately halfway during assertion of DATAX. Other embodiments are contemplated that enable positioning of DATAX to favor increased setup time or increased hold time for DATAX. The delay element 801 is a replica of the delay elements 501, 601, 701, 801 described with reference to FIGS. 1-8, and comprises 15 matched inverter pairs (not shown). Thus, in one embodiment, DDATAX[15:0] comprises 16 successively delayed versions of DATAX, ranging from no delay to delay through all 15 inverter pairs.

The value of LAG[3:0] is employed by the mux 802 to select one of the signals on DDATAX[15:0]. The selected signal is routed to the bit receiver 804 on SDATAX. When DSTROBEX switches, the bit receiver 804 registers the value of SDATAX and outputs this value on RDATAX. RDATAX represents the received state of DATAX.

Figure 9:
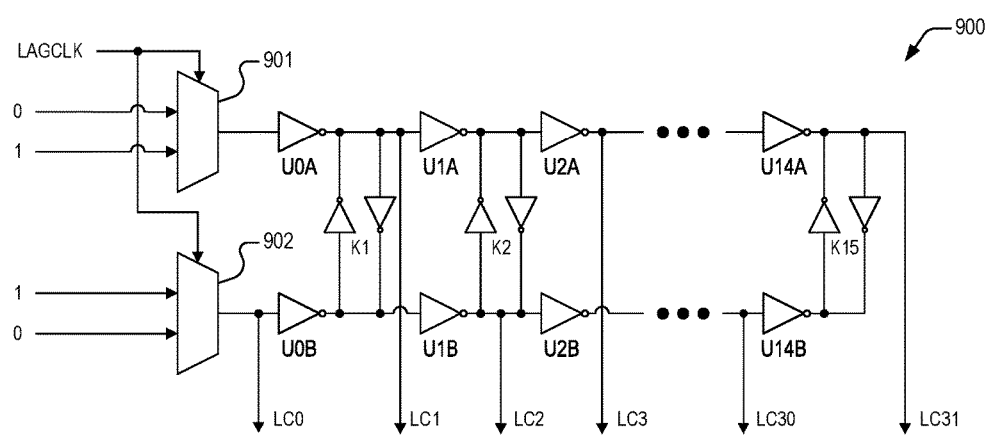
FIG. 9 is a block diagram detailing a precision delay element according to the present invention.

Turning now to FIG. 9, a block diagram is presented detailing a precision delay element 900 according to the present invention. The precision delay element 900 may be substituted for any of the delay elements 501, 601, 701, 801 discussed above with reference to FIGS. 5-8, and is employed to provide both finer resolution of lag measurement and lag introduction in embodiments of the present invention. The delay element 900 includes a first mux 901 having a first input tied to a logic low level (i.e., "0") and a second input tied to a logic high level (i.e., "1"). In one embodiment, the high level comprises a core voltage (i.e., VDD) and the low level comprises a reference voltage (i.e., ground). Other embodiments are contemplated. The first mux 901 employs a lag clock LAGCLK as a select input to select either the signal on the first input or the second input. The element 900 also includes a second mux 902 having a first input tied to a 1 and a second input tied to a 0, which is the opposite configuration from that of the first mux 901. LAGCLK is also coupled to the select input of the second mux 902. In the embodiments of FIGS. 5-7, LAGCLK represents a signal for measurement of propagation delay as the like-named signals. In the embodiment of FIG. 8, LAGCLK represents the data bit DATAX to be delayed.

The delay element 900 includes a first group of 15 delay inverters, U0A-U14A, coupled in series cascade configuration, where the output of the first mux 901 is coupled to the input of U0A and the output of U14A is coupled to a most delayed signal LC31. The delay element 900 also includes a second group of 15 delay inverters, U0B-U14B, coupled in series cascade configuration, where the output of the second mux 902 is coupled to the input of U0B and the input of U14B is coupled to a next most delayed signal LC30.

The outputs of all like numbered delay inverters (e.g., U0A and U0B, U5A and U5B) are coupled together via full keeper inverter pairs K1-K15. The outputs of even numbered inverters from the first group of 15 delay inverters (i.e., U0A, U2A, etc.) are coupled to odd numbered successively delayed signals (i.e., LC1, LC3, . . . , LC31) and the inputs of even numbered inverters from the second group of 15 delay inverters (i.e., U0B, U2B, etc.) are coupled to even numbered successively delayed signals (i.e., LC0, LC2, . . . , LC30). Each of the delay inverters U0A-U14A, U0B-U14B are matched. In one embodiment, the delay through each inverter is substantially 20 picoseconds and thus the most delayed signal LC31 represents a delay in LAGCLK of approximately 300 picoseconds.

In operation, either state of LAGCLK may be employed to generate the successively delayed versions that are output on LC0-LC31, although a high level will be used in this operational discussion. Accordingly, in one embodiment, when LAGCLK is 1, then the input to U0A is 0 and the input to U0B is 1. Thus, LC0 is a 1, the output of U0A is 1, the output of U0B is a 0, and the value of LC1 is a 1 after a delay of one inverter. And so on until the most delayed version of LAGCLK is presented on LC31. Keepers K1-K15 function to ensure that state changes on LC1-LC31 are synchronized with regard to state changes of their corresponding like numbered inverter pair U0[A:B]-U14[A:B].

The precision delay element 900 according to the present invention may be employed by any of the muxes 502, 602, 702, 802, 902 described above. However, the width of corresponding lag busses must be increased by one bit to accommodate the increased resolution provided.

Portions of the present invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, a microprocessor, a central processing unit, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the invention are typically encoded on some form of program storage medium or implemented over some type of transmission medium. The program storage medium may be electronic (e.g., read only memory, flash read only memory, electrically programmable read only memory), random access memory magnetic (e.g., a floppy disk or a hard drive) or optical (e.g., a compact disk read only memory, or "CD ROM"), and may be read only or random access. Similarly, the transmission medium may be metal traces, twisted wire pairs, coaxial cable, optical fiber, or some other suitable transmission medium known to the art. The invention is not limited by these aspects of any given implementation.

The particular embodiments disclosed above are illustrative only, and those skilled in the art will appreciate that they can readily use the disclosed conception and specific embodiments as a basis for designing or modifying other structures for carrying out the same purposes of the present invention, and that various changes, substitutions and alterations can be made herein without departing from the scope of the invention as set forth by the appended claims.

What is claimed is:

1. An apparatus that compensates for misalignment on a synchronous data bus, the apparatus comprising: a replica radial distribution element, configured to receive a lag pulse signal, and configured to generate a replicated strobe signal, wherein said replica radial distribution element comprises replicated propagation path lengths, loads, and buffering of a radial distribution network for a strobe; a bit lag control element, configured to measure a time between assertion of said lag pulse signal and assertion of said replicated strobe signal, and configured to generate a first value on a lag bus that indicates said time, said bit lag control element comprising: delay lock control, configured to select one of a plurality of successively delayed versions of said lag pulse signal that coincides with said assertion said replicated strobe signal, and configured to generate a second value on a lag select bus that indicates said time, wherein said delay lock control selects said one of a plurality of successively delayed versions of said lag pulse signal by incrementing and decrementing bus states of select inputs on a mux, and wherein said plurality of successively delayed versions comprises inputs to said roux, and wherein said plurality of successively delayed versions comprises outputs of a first plurality of series-coupled matched inverter pairs; and a synchronous lag receiver, coupled to said bit lag control element, configured to receive a first one of a plurality of radially distributed strobes and a data bit, and configured to delay registering of said data bit by said time.

2. The apparatus as recited in claim 1, wherein said strobe and said data bit are received by a corresponding device within which the apparatus is disposed and are sourced by a transmitting device.

3. The apparatus as recited in claim 2, wherein the corresponding device comprises an x86-compatible microprocessor.

4. The apparatus as recited in claim 1, wherein said time is expressed as a function of zero or more of said first plurality series-coupled matched inverter pairs.

5. The apparatus as recited in claim 4, wherein said synchronous lag receiver comprises a second plurality of series-coupled matched inverter pairs that are replicas of said first plurality of series-coupled matched inverter pairs.

6. The apparatus as recited in claim 5, wherein said synchronous lag receiver delays registering of said data bit by propagating said data bit through zero or more of said second plurality of series-coupled matched inverter pairs as indicated by said value.

7. The apparatus as recited in claim 1, further comprising: a radial distribution element, configured to receive said strobe and to generate said plurality of radially distributed strobes, wherein a corresponding plurality of synchronous lag receivers each receive one of said plurality of radially distributed strobes, and wherein each of said plurality of radially distributed strobes exhibit equivalent propagation characteristics relative to said strobe at said corresponding plurality of synchronous lag receivers.

8. An apparatus that compensates for misalignment on a synchronous data bus, the apparatus comprising: a microprocessor, comprising: a replica radial distribution element, configured to receive a lag pulse signal, and configured to generate a replicated strobe signal, wherein said replica radial distribution element comprises replicated propagation path lengths, loads and buffering of a radial distribution network for a strobe; a bit lag control element, configured to measure a time between assertion of said lag pulse signal and assertion of said replicated strobe signal, and configured to generate a first value on a lag bus that indicates said time, said bit lag control element comprising: delay lock control, configured to select one of a plurality of successively delayed versions of said lag pulse signal that coincides with said assertion said replicated strobe signal, and configured to generate a second value on a lag select bus that indicates said time, wherein said delay lock control selects said one of a plurality of successively delayed versions of said lag pulse signal by incrementing and decrementing bus states of select inputs on a mux, and wherein said plurality of successively delayed versions comprises inputs to said mux, and wherein said plurality of successively delayed versions comprises outputs of a first plurality of series-coupled matched inverter pairs; and a synchronous lag receiver, coupled to said bit lag control element, configured to receive a first one of a plurality of radially distributed strobes and a data bit, and configured to delay registering of said data bit by said time.

9. The apparatus as recited in claim 8, wherein said strobe and said data bit are received by said microprocessor and are sourced by a transmitting device.

10. The apparatus as recited in claim 9, wherein said microprocessor comprises an x86-compatible microprocessor.

11. The apparatus as recited in claim 8, wherein said time is expressed as a function of zero or more of said first plurality of series-coupled matched inverter pairs.

12. The apparatus as recited in claim 11, wherein said synchronous lag receiver comprises a second plurality of series-coupled matched inverter pairs that are replicas of said first plurality of series-coupled matched inverter pairs.

13. The apparatus as recited in claim 12, wherein said synchronous lag receiver delays registering of said data bit by propagating said data bit through zero or more of said second plurality of series-coupled matched inverter pairs as indicated by said value.

14. The apparatus as recited in claim 8, wherein said radial distribution network receives said strobe and generates said plurality of radially distributed strobes, and wherein a corresponding plurality of synchronous lag receivers each receive one of said plurality of radially distributed strobes, and wherein each of said plurality of radially distributed strobes exhibit equivalent propagation characteristics relative to said strobe at said corresponding plurality of synchronous lag receivers.

15. A method that compensates for misalignment on a synchronous data bus, the method comprising: replicating propagation path length, loads, and buffering of a radial distribution network for a strobe, receiving a lag pulse signal, and generating a replicated strobe signal by employing the replicated propagation path lengths, loads, and buffering; measuring a time between assertion of the lag pulse signal and assertion of the replicated strobe signal, said measuring comprising: selecting one of a plurality of successively delayed versions of the lag pulse signal that coincides with assertion of the replicated strobe signal, wherein said selecting one of a plurality of successively delayed versions of the lag pulse signal comprises: incrementing and decrementing bus states of select inputs on a mux, wherein the plurality of successively delayed versions comprises inputs to the mux, and wherein said plurality of successively delayed versions comprises outputs of a first plurality of series-coupled matched inverter pairs; on a lag bus, generating a value that indicates the time; and within a synchronous lag receiver, receiving a first one of a plurality of radially distributed strobes and a data bit, and delaying registering of the data bit by the time.

16. The method as recited in claim 15, wherein the strobe and the data bit are received by a corresponding device and are sourced by a transmitting device.

17. The method as recited in claim 16, wherein the corresponding device comprises an x86-compatible microprocessor.

18. The method as recited in claim 15, wherein the time is expressed as a function of zero or more of the first plurality of series-coupled matched inverter pairs.

19. The method as recited in claim 18, further comprising: replicating the first plurality of series-coupled matched inverter pairs via a second plurality of series-coupled matched inverter pairs.

20. The method as recited in claim 19, wherein said delaying comprises:

propagating the data bit through zero or more of the second plurality of series-coupled matched inverter pairs as indicated by the value.

21. The method as recited in claim 15, further comprising: generating the plurality of radially distributed strobes, and distributing the plurality of radially distributed strobes to a corresponding plurality of synchronous lag receivers, wherein each of the plurality of radially distributed strobes exhibit equivalent propagation characteristics relative to the strobe at the corresponding plurality of synchronous lag receivers.

* * * * *